(12) United States Patent
Pignotti

(10) Patent No.: US 7,753,199 B2
(45) Date of Patent: Jul. 13, 2010

(54) USB DOCK

(75) Inventor: Christopher S. Pignotti, Phoenix, AZ (US)

(73) Assignee: US Digital Media, Inc., Phoenix, AZ (US)

( * ) Notice: Subject to any disclaimer, the term of this patent is extended or adjusted under 35 U.S.C. 154(b) by 0 days.

(21) Appl. No.: 12/425,923

(22) Filed: Apr. 17, 2009

(65) Prior Publication Data

US 2009/0265497 A1    Oct. 22, 2009

Related U.S. Application Data

(63) Continuation of application No. PCT/US2008/061015, filed on Apr. 21, 2008.

(51) Int. Cl.
*B65D 85/00* (2006.01)

(52) U.S. Cl. .............. 206/307; 206/308.3; 206/472; 40/124.06; 710/303; 439/577

(58) Field of Classification Search ............ 206/307, 206/320, 305, 701, 728, 722, 706, 308.3, 206/472, 473; 710/303; 361/684, 685, 825; 40/124.06; 235/486; 439/165, 148, 296, 439/345, 350, 353, 367, 528, 577
See application file for complete search history.

(56) References Cited

U.S. PATENT DOCUMENTS

| 4,702,374 | A |   | 10/1987 | Kelner |   |
|---|---|---|---|---|---|
| 5,730,284 | A | * | 3/1998 | Farrah | .............. 206/307 |
| 6,733,329 | B2 |   | 5/2004 | Yang |   |
| 6,739,452 | B2 |   | 5/2004 | Rochelo |   |
| 6,766,952 | B2 | * | 7/2004 | Luu | .............. 235/451 |
| 6,839,239 | B1 |   | 1/2005 | Lee |   |
| 7,293,647 | B2 |   | 11/2007 | Wong et al. |   |
| 7,306,159 | B1 |   | 12/2007 | Rochelo |   |
| 7,448,905 | B1 | * | 11/2008 | Lin | .............. 439/577 |
| 7,461,742 | B2 |   | 12/2008 | Or et al. |   |
| 2003/0062275 | A1 |   | 4/2003 | Rochelo |   |
| 2004/0038592 | A1 |   | 2/2004 | Yang |   |
| 2005/0029137 | A1 | * | 2/2005 | Wang | .............. 206/320 |
| 2005/0150796 | A1 |   | 7/2005 | Wong |   |
| 2005/0279655 | A1 | * | 12/2005 | Chen | .............. 206/307.1 |
| 2006/0144751 | A1 |   | 7/2006 | Tsang |   |
| 2006/0266671 | A1 |   | 11/2006 | Langerak |   |
| 2007/0163913 | A1 |   | 7/2007 | Or et al. |   |
| 2007/0175776 | A1 |   | 8/2007 | Reeves |   |
| 2007/0268111 | A1 |   | 11/2007 | Chng et al. |   |
| 2008/0023343 | A1 |   | 1/2008 | Macor |   |
| 2008/0023344 | A1 |   | 1/2008 | Macor |   |
| 2008/0156676 | A1 | * | 7/2008 | Verma | .............. 206/307 |
| 2008/0185312 | A1 |   | 8/2008 | Geurts et al. |   |
| 2008/0245695 | A1 |   | 10/2008 | Baker et al. |   |
| 2008/0302698 | A1 |   | 12/2008 | Baker et al. |   |
| 2009/0014344 | A1 |   | 1/2009 | Altman et al. |   |
| 2009/0165343 | A1 | * | 7/2009 | Miller et al. | .............. 40/124.06 |
| 2009/0187692 | A1 | * | 7/2009 | Czarnek et al. | .............. 710/300 |

* cited by examiner

*Primary Examiner*—J. Gregory Pickett
*Assistant Examiner*—Andrew Perreault
(74) *Attorney, Agent, or Firm*—Venable, Campillo, Logan & Meaney, P.C.

(57) ABSTRACT

A USB device securement apparatus is disclosed. The USB device securement apparatus includes a dock that includes a device side and an attachment side. The device side of the dock receives the USB device and the attachment side of the dock is coupled to a surface. This arrangement provides proper securement of the USB device during retail, transportation, and storage.

7 Claims, 2 Drawing Sheets

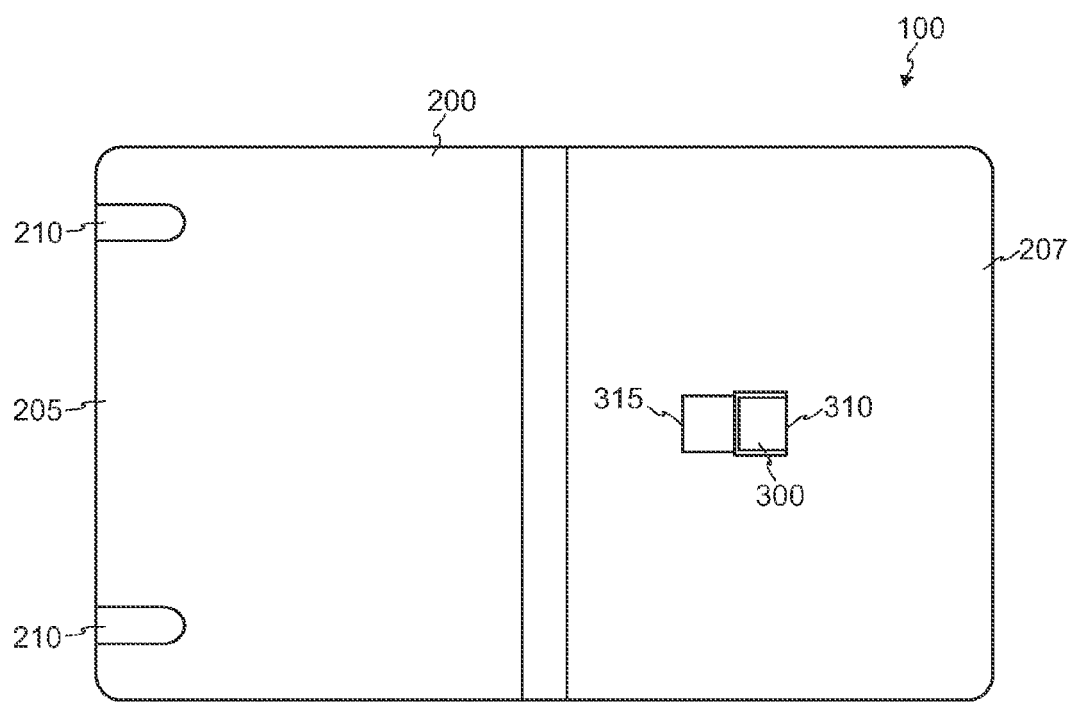
Fig. 1
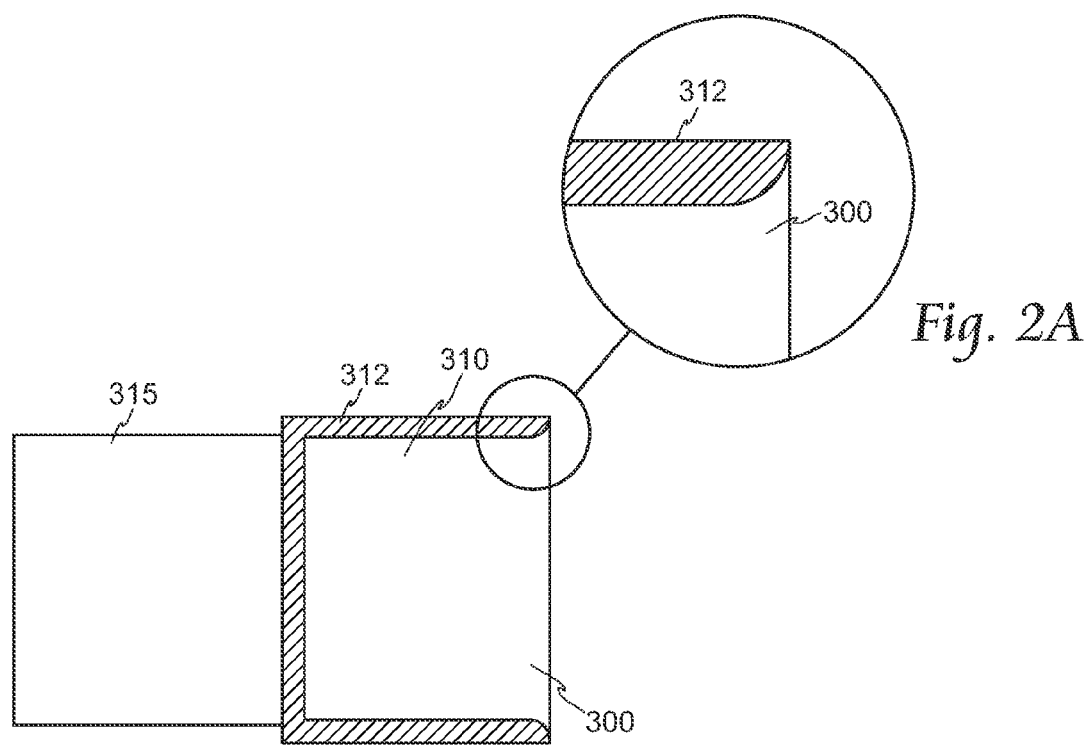
Fig. 2A
Fig. 2

USB DOCK

FIELD OF THE INVENTION

The present invention relates to an apparatus that holds any type of a Universal Serial Bus ("USB") device.

BACKGROUND OF THE INVENTION

The use of media storage devices such as USBs, compact disks (CD), and digital video disks (DVD) are known in the prior art. For the purposes of retail, transportation, and storage, CD and DVD media devices are usually held in place by a dock and are normally contained in a packaging case. Currently, however, there is no USB dock that will properly secure a USB device within a packaging case or to other surfaces. Therefore, it is desirable to have a securement and packaging apparatus for a USB device where the apparatus is a dock that secures the USB device within a packaging case or to a surface.

Various techniques have been disclosed in U.S. Pat. Nos. 4,702,374 (Keiner), 6,733,329 (Yang), 6,739,452 (Rochelo), 6,839,239 (Lee), 7,293,647 (Wong et al.), 7,306,159 (Rochelo), U.S. Patent Application Nos. 20030062275 (Rochelo), 20040038592 (Yang), 20050150796 (Wong), 20060144751 (Tsang), 20060266671 (Langerak), and 20070163913 (Or et al.) to overcome the problems with media securement devices. However, these disclosures suffer from one or more of the following disadvantages. First, none of these inventions include a dock for a USB device. Second, none of these inventions are simple designs that are easy and relatively inexpensive to manufacture.

SUMMARY OF THE INVENTION

A securement apparatus for use with a USB device comprises a dock. The dock includes a device side and an attachment side. The USB device fits into the device side of the dock and the attachment side couples the dock to a surface.

The present invention is directed to a securement apparatus for use with a USB device.

It is a further object of the present invention to provide a securement apparatus for use with a USB device such that the securement apparatus is integrally coupled to a surface.

It is a further object of the present invention to provide a securement apparatus that protects and secures a USB device.

It is a further object of the present invention to provide a securement apparatus that protects and secures a USB flash drive.

It is a further object of the present invention to provide a securement apparatus that protects and secures a USB flash drive and its protective cap.

It is a further object of the present invention to provide a securement apparatus that is easy and inexpensive to manufacture.

The novel features that are considered characteristic of the invention are set forth with particularity in the appended claims. The invention itself, however, both as to its structure and its operation together with the additional object and advantages thereof will best be understood from the following description of the preferred embodiment of the USB dock when read in conjunction with the accompanying drawings. Unless specifically noted, it is intended that the words and phrases in the specification and claims be given the ordinary and accustomed meaning to those of ordinary skill in the applicable art or arts. If any other meaning is intended, the specification will specifically state that a special meaning is being applied to a word or phrase. Likewise, the use of the words "function" or "means" in the Description of Preferred Embodiments is not intended to indicate a desire to invoke the special provision of 35 U.S.C. §112, paragraph 6 to define the invention. To the contrary, if the provisions of 35 U.S.C. §112, paragraph 6 are sought to be invoked to define the invention (s), the claims will specifically state the phrases "means for" or "step for" and a function, without also reciting in such phrases any structure, material, or act in support of the function.

Moreover, even if the provisions of 35 U.S.C. §112, paragraph 6 are invoked to define the inventions, it is intended that the inventions not be limited only to the specific structure, material or acts that are described in the preferred embodiments, but in addition, include any and all structures, materials or acts that perform the claimed function, along with any and all known or later developed equivalent structures, materials, or acts for performing the claimed function.

BRIEF DESCRIPTION OF THE DRAWINGS

FIG. 1 shows a top view of a preferred embodiment of the invention integrated into an outer packaging surface.

FIG. 2 shows a cross section top view of the dock of a preferred embodiment of the invention.

FIG. 2A shows a cross section of the inside of the dock of the preferred embodiment of the invention.

DESCRIPTION OF PREFERRED EMBODIMENTS

Figure 4A:
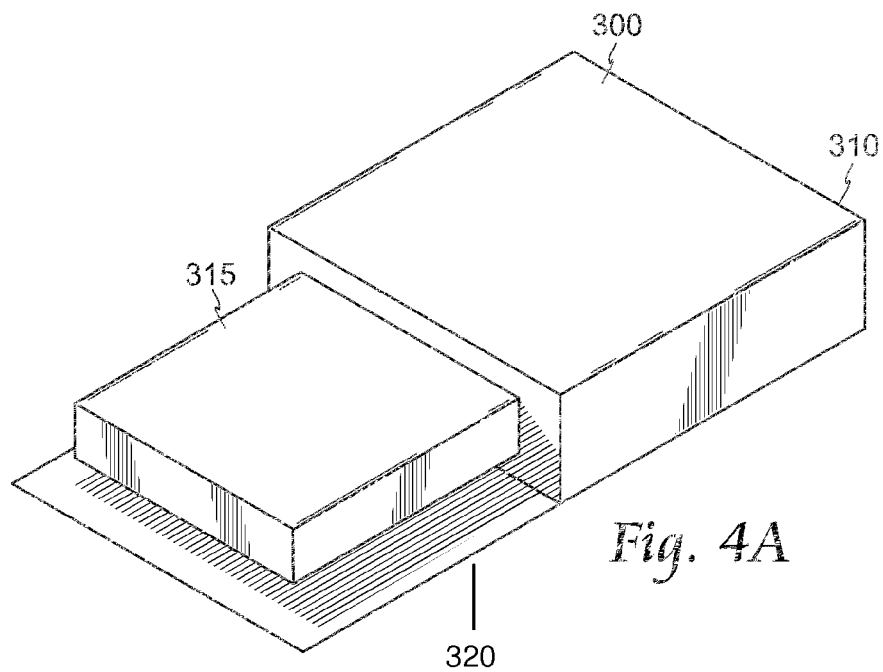
FIG. 4A shows a perspective view of the dock of the preferred embodiment of the invention.
Figure 4B:
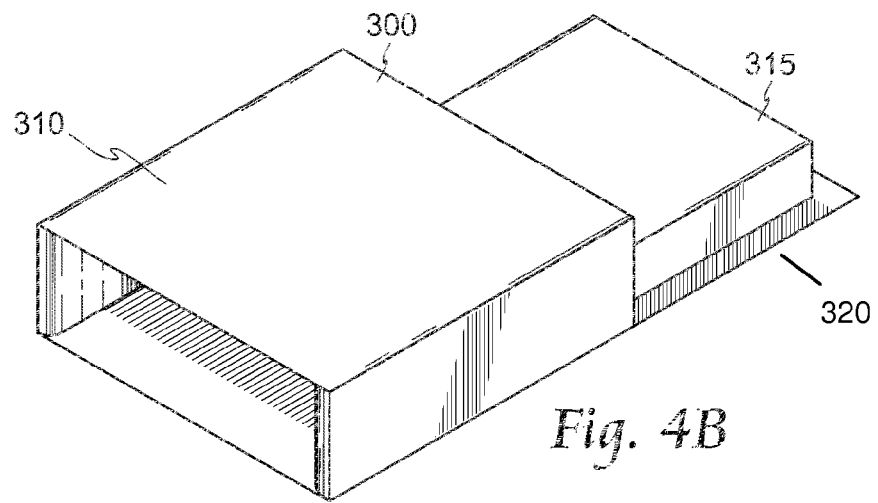
FIG. 4B shows a perspective view of the dock of the preferred embodiment of the invention.

As shown in FIGS. 4A and 4B, a preferred embodiment of the USB dock 300 includes a device side 310 and an attachment side 320. A USB device is coupled to the dock 300 such that it cannot be detached during retail, transportation, or storage of the device. The device side 310 of the dock 300 has a hollowed center to allow the USB device to slide in to place such that the USB device is secured to the dock 300. The attachment side 320 of the dock 300 can be coupled to any surface such that the dock 300 and USB device are secured in place. This coupling can be via a mold where the dock 300 is formed as part of an outer packaging 200, as seen in FIG. 1, or via an adhesive, such as glue, hook and loop type fastener, etc. (not shown) that grips the surface.

As shown in FIGS. 2 and 2A, the inside of the device side 310 of the dock 300 includes a rounded interior wall 312. This wall 312 allows a smooth insertion of the USB device into the device side 310 of the dock 300. Because all USB devices are the same size, the dimensions of the device side 310 of the dock 300 will be a standardized size. This feature allows easy manufacturing of the dock 300.

In the preferred embodiment of the dock 300, the attachment side 320 of the dock 300 is a round plastic disc that is molded onto the dock 300. The round disc includes an adhesive that is used to couple the dock 300 to a surface. The adhesive can be glue, hook and loop type fastener, or any other suitable adhesive material. Additionally, the surface to which the dock 300 is coupled can be any type of smooth surface such as a plastic packaging case, a wall, a tabletop, a display rack, etc. The dock 300 secures the USB device to the surface and aids in shipping, display, storage, etc.

Figure 3:
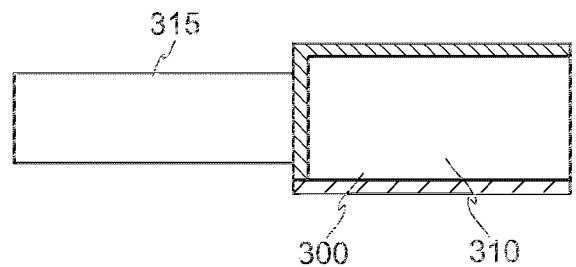
FIG. 3 shows a cross section side view of the dock of the preferred embodiment of the invention.

In an alternate embodiment of the invention, the USB dock 300 is designed to secure a USB flash drive. In this embodiment, the dock 300 may include a cap side 315 in addition to the device side 310. The cap side 315 of the dock 300 secures the protective cap of the USB flash drive. As shown in FIGS. 2-4, the device side 310 and the cap side 315 of the dock 300 are oriented such that they face opposite directions. The cap side 315 of the dock 300 is structured to receive the protective cap of the USB flash drive. The dock 300, however, does not have to include a cap side 315. This alternate embodiment accommodates USB flash drives that do not include a protective cap.

In this embodiment, the cap side 315 of the dock 300 and the device side 310 of the dock 300 are coupled together such that they are one piece. Because the USB flash drive and its protective cap are, by their nature, a standardized size, the dock 300 is easily sized to accommodate the pieces. Further, it is preferred that the dock 300 is made of plastic or some other rigid, protective material. The dock 300, however, can be made of any appropriate material.

As seen in FIG. 1, in this embodiment, the outer surface is a plastic packaging case 200. The plastic packaging 200 is a standard 14 mm digital video disc (DVD) case. When the case is open, the left side 205 of the outer packaging 200 includes the standard clips 210 that hold a booklet with information and instructions for operating the enclosed media device. The right side 207 of the outer packaging 200 includes the dock 300. The dock 300 is integrally molded to the outer packaging 200 such that it will not separate from the outer packaging 200 during shipment or display. This can be done with adhesive or by molding the outer packaging 200 and the dock 300 as one piece. Alternate embodiments of the outer packaging 200 include compact disc (CD) jewel cases, software packaging, and video game packaging to name a few. While it is preferred that the outer packaging is made of plastic, it can be any material that will support and protect the media device inside and will hold the dock 300 securely in place. The dock 300 can be coupled to either side of the outer packaging 200. It is preferred, however, to mold the dock 300 on the right side of the packaging. Additionally, the dock 300 can be located at any location vertically and/or horizontally on the outer packaging 200. In the preferred embodiment of the invention, the dock 300 is positioned such that an additional type of media (i.e., CD, DVD, video game) can be placed on the same side of the outer packaging 200 as the USB device.

The preferred embodiment of the invention is described in the Description of Preferred Embodiments. While these descriptions directly describe the one embodiment, it is understood that those skilled in the art may conceive modifications and/or variations to the specific embodiments shown and described herein. Any such modifications or variations that fall within the purview of this description are intended to be included therein as well. Unless specifically noted, it is the intention of the inventor that the words and phrases in the specification and claims be given the ordinary and accustomed meanings to those of ordinary skill in the applicable art(s). The foregoing description of a preferred embodiment and best mode of the invention known to the applicant at the time of filing the application has been presented and is intended for the purposes of illustration and description. It is not intended to be exhaustive or to limit the invention to the precise form disclosed, and many modifications and variations are possible in the light of the above teachings. The embodiment was chosen and described in order to best explain the principles of the invention and its practical application and to enable others skilled in the art to best utilize the invention in various embodiments and with various modifications as are suited to the particular use contemplated.

What is claimed is:

1. A securement apparatus for use with a Universal Serial Bus device comprising:
   a. a package having a surface and a dock, wherein said dock further comprises:
      i. a device side;
      ii. a cap side; and
      iii. an attachment side;
   b. wherein said device side of said dock receives said Universal Serial Bus device;
   c. wherein said attachment side of said dock is coupled to the surface of the package; and
   d. wherein said cap side includes a protrusion structured to receive a cap of the Universal Serial Bus device.

2. The apparatus of claim 1 wherein said dock is plastic.

3. The apparatus of claim 1 wherein said surface is an outer packaging.

4. The apparatus of claim 3 wherein said attachment side of said dock is integrally molded into said outer packaging wherein said dock and said outer packaging are one piece.

5. The apparatus of claim 3 wherein said attachment side of said dock further comprises an adhesive wherein said adhesive couples said dock to said outer packaging.

6. The apparatus of claim 3 wherein said outer packaging is selected from the group consisting of:
   a. plastic;
   b. paper; and
   c. a combination of plastic and paper.

7. The apparatus of claim 1 wherein said Universal Serial Bus device is a Universal Serial Bus flash drive.

* * * * *